US005798532A

United States Patent [19]

Linehan

[11] Patent Number: 5,798,532

[45] Date of Patent: Aug. 25, 1998

[54] APPARATUS FOR DETERMINING WARP IN SEMICONDUCTOR WAFER CASSETTES

[75] Inventor: Daniel S. Linehan, Monterey, Calif.

[73] Assignee: Integrated Device Technology, Inc., Santa Clara, Calif.

[21] Appl. No.: 871,543

[22] Filed: Jun. 9, 1997

[51] Int. Cl.[6] .......... G01N 21/86

[52] U.S. Cl. .......... 250/559.22; 250/559.45; 356/376

[58] Field of Search .......... 250/559.22, 559.4, 250/559.45, 559.3, 548; 356/376, 430, 399–401; 414/940

[56] References Cited

U.S. PATENT DOCUMENTS

| | | | |
|---|---|---|---|
| 3,714,491 | 1/1973 | McIntyre et al. | 313/96 |
| 4,803,373 | 2/1989 | Imamura et al. | 250/559.4 |
| 4,903,610 | 2/1990 | Matsumoto et al. | 104/118 |
| 5,239,182 | 8/1993 | Tateyama et al. | 250/559.37 |
| 5,308,993 | 5/1994 | Holman et al. | 250/559.4 |
| 5,319,216 | 6/1994 | Mokuo et al. | 250/559.4 |
| 5,485,759 | 1/1996 | Goff et al. | 73/865.9 |

*Primary Examiner*—Que Le
*Attorney, Agent, or Firm*—James W. Huffman

[57] ABSTRACT

An apparatus for measuring warp of a semiconductor wafer cassette is provided. A wafer cassette is secured within a housing that places the end wall of the cassette in a predetermined position. An array of laser diodes is arranged to transmit a light reference across the end wall of the cassette. An array of photo detectors is placed opposite the laser diodes to detect the transmitted light reference. If the end wall of the cassette is not warped, the transmitted light is blocked by the cassette. If the end wall of the cassette is warped, some or all of the photo detectors receive the transmitted light. Measurement of the light received by the photo detectors is used to determine the nature and degree of warp on the end wall of the cassette.

31 Claims, 4 Drawing Sheets

236 230 250 252 200 234 240 254 232 201 208 202 200 210 220 222 203 212

APPARATUS FOR DETERMINING WARP IN SEMICONDUCTOR WAFER CASSETTES

BACKGROUND OF THE INVENTION

1. Field of the Invention

This invention relates in general to the field of semiconductor processing, and more particularly to a device for measuring warp in semiconductor wafer cassettes.

2. Description of the Related Art

Wafer carriers, or cassettes, have been used for many years in the semiconductor arts to secure a number of semiconductor wafers in a rigid housing, and to allow the wafers to be processed at the same. Generally, such carriers are constructed to form a plurality of slots (e.g., 25–50), into which semiconductor wafers are placed for transport and processing.

Depending on the stage of processing, different cassette types may be used. For example, during washing stages, such as chemical cleaning, a chemical-resistant plastic, or possibly Teflon® material is used for the cassettes. In furnace operations, which require wafers to be baked at very high temperatures, it is common to utilize a material such as Quartz, which can withstand very high temperatures. In between these processing steps, automated transfer devices are used to transfer the wafers from one type of cassette to another.

More specifically, during chemical cleaning, wafers are placed into a Teflon cassette. The cassette is then immersed, sprayed and/or rinsed with liquids or gases. Some of the chemical baths include corrosive materials, and are located in chambers that reach high temperatures. Additionally, during the cleaning process, the cassette may be placed into a fixture that rotates the cassette at high speeds, placing considerable physical stress on the cassette.

Because of the corrosive environment into which the cassettes are used, as well as the temperatures and physical stresses placed on the cassette, it is common for cassettes to become warped after repeated use. For example, slots may begin to vary in alignment that in turn may alter the registry of particular wafers. Such distortion in cassettes creates undesirable variances in the manufacturing process. As cassettes become warped, the locations of the wafers inside the cassette may vary outside of the tolerance range of the automated wafer handling devices that are responsible for transferring the wafers from one cassette to another.

For example, an automated transfer device is typically programmed to pick up wafers within a Teflon cassette, and transfer these wafers to a quartz cassette or boat. The transfer device requires that wafers within a cassette be located within prescribed tolerances. If the Teflon cassette has become warped, placing the wafers outside the prescribed tolerances, there is a strong possibility that the transfer device will mishandle the wafers. Since the transfer device often operates at high speed, mishandling can cause scratches, chips and even broken wafers. In addition, a chip off one wafer can end up damaging the surface of surrounding wafers. Thus, it is not uncommon that when a cassette becomes warped outside of predetermined tolerances, mishandling results in the damage of several wafers. The financial loss from such an incident is substantial. Not only is there a delay in producing the final semiconductor product, but all of the materials used to fabricate, clean and process the wafers are lost.

It should therefore be appreciated that the use of warped cassettes should be reduced, or altogether eliminated. However, the prior art has heretofore not provided sufficient mechanisms to either test cassettes for warp, or ensure that warped cassettes are not used in the semiconductor manufacturing process.

One attempt that has been made is described in U.S. Pat. No. 5,485,759 entitled BOAT TEST APPARATUS, to Goff et al. This invention provides a test fixture for a cassette that holds the cassette to be tested in a predetermined position. Test wafers are then inserted and removed into the cassette to determine whether the wafers properly seat within the cassette. If the wafers cannot be inserted into the cassette, the cassette is considered to fall outside of predefined tolerances.

However, Goff et al., relies on interaction between test wafers, a mounting structure which secures a cassette, and a movement arm to translate the wafers in and out of the cassette, to perform an accurate test. If any part of the test device falls outside of a tolerance range, the test will not provide the correct result. Moreover, the test apparatus does not provide any indication of the nature of warp in a cassette. It is merely a pass/fail test structure. The device, therefore, cannot trend the degree of warp over the lifetime of a cassette.

What is needed is an apparatus that solves the above problems by providing a mechanism that easily and accurately tests warp in semiconductor cassettes, and that provides an indication of the type of warp within a cassette.

SUMMARY

To address the above-detailed deficiencies, it is an object of the present invention to provide a test apparatus for measuring the warp on a end wall of a semiconductor wafer cassette.

Accordingly, in the attainment of the aforementioned object, it is a feature of the present invention to provide an apparatus for measuring warp of a wafer cassette. The apparatus includes mounting structure, light transmitter, light receiver, and a housing. The mounting structure secures the wafer cassette in a predetermined position. The light transmitter is disposed at a top end of a first surface of the wafer cassette when the wafer cassette is secured by the mounting structure. The light transmitter transmits a light reference along a first plane that is substantially parallel to the first surface of the wafer cassette. The light receiver is disposed at a bottom end of the first surface of the wafer cassette when the wafer cassette is secured by said mounting structure. The light receiver receives the light reference transmitted by the light transmitter. The housing is connected to the mounting structure, to the light transmitter, and to the light receiver to establish a repeatable reference position between the wafer cassette and the light transmitter and the light receiver. Measurement of light received by the light receiver from the light transmitter indicates warp on the first surface of the wafer cassette.

An advantage of the present invention is that warped cassettes may be detected, prior to being used to process semiconductor wafers.

An additional advantage of the present invention is that trending of warped cassettes may be detected and recorded for historical use, tracking, and service life prediction.

Another advantage of the present invention is that when the apparatus is used to test wafer cassettes, on a regular basis, wafer damage resulting from warped cassettes can be significantly reduced, if not altogether eliminated.

In another aspect, it is a feature of the present invention to provide a measurement system that determines surface warp on a end wall of a semiconductor wafer cassette. The measurement system includes a housing, a mounting mechanism, an array of laser diodes, an array of photo detectors, and electronic test equipment. The mounting mechanism is attached to the housing, and secures the wafer cassette in a predetermined position. The predetermined position places the end wall of the wafer cassette in parallel with, and in proximity to, a first plane. The array of laser diodes is also attached to the housing, and is arranged in parallel to the first plane. The array of laser diodes transmits a light reference across the end wall of the wafer cassette. The array of photo detectors is attached to the housing, and is arranged in parallel to the first plane, and opposite the array of laser diodes. The array of photo detectors receives the transmitted light reference. The electronic test equipment is connected to the array of photo detectors, and monitors the transmitted light reference received by the array of photo detectors. The amount of transmitted light reference received by the array of photo detectors varies, depending on the amount of warp on the end wall of the wafer cassette.

An advantage of the present invention is that by using it regularly to detect cassette warp, significant financial losses, resulting from processing wafers in warped cassettes, may be retained.

Another advantage is that repeated use of the present invention can provide valuable information on the relationship between processing stages, and their effect on particular cassette materials.

BRIEF DESCRIPTION OF THE DRAWINGS

These and other objects, features, and advantages of the present invention will become better understood with regard to the following description, and accompanying drawings where.

DETAILED DESCRIPTION

Figure 1:
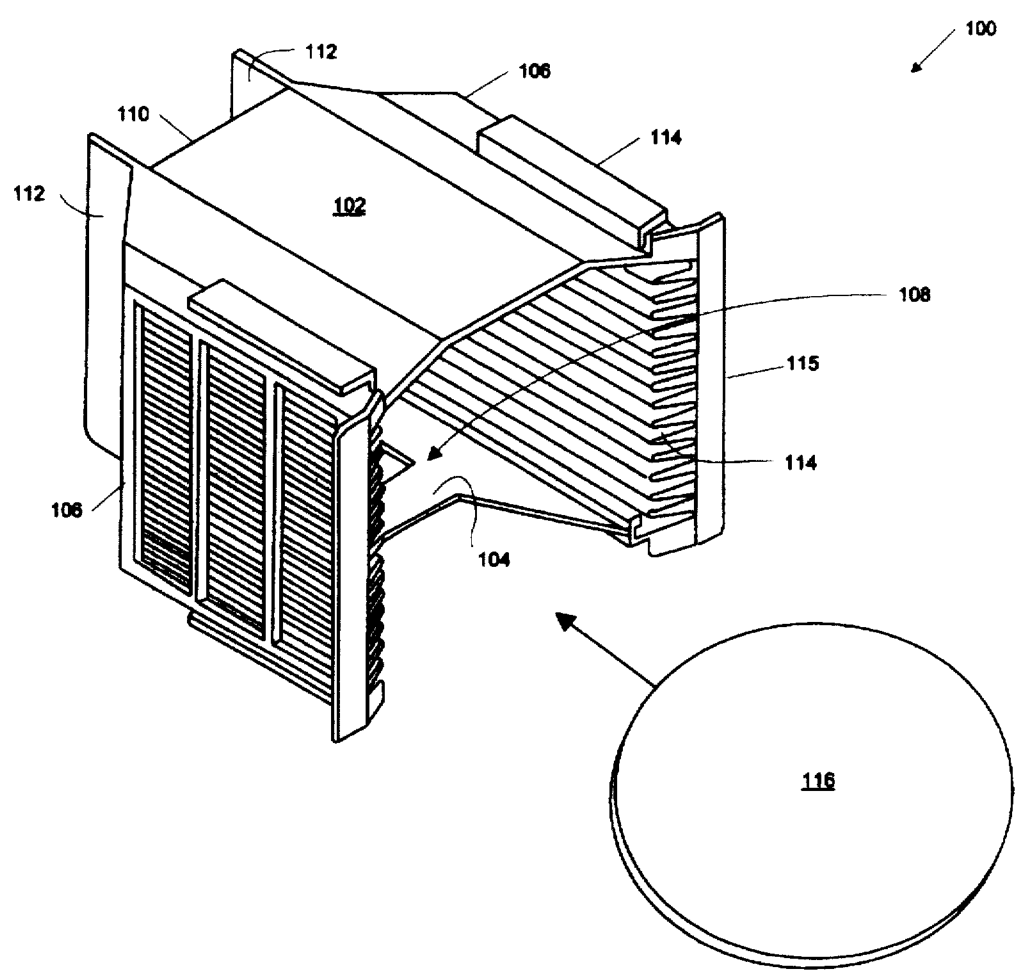
FIG. 1 is a top left perspective view of a semiconductor wafer cassette.

Referring to FIG. 1, a wafer cassette 100 is shown. The cassette 100 includes an end wall 102, and an H-bar 104, that are connected by two side walls 106 to form substantially a rectangular box. The cassette 100 has an opening 108 into which a plurality of wafers 116 are inserted. The wafers 116 are secured by a plurality of slots 114 fabricated on the inside of the side walls 106. The slots 114 both secure the wafers 116 inside the cassette 100, as well as separate the wafers 116 from each other. The cassette 100 also has a bottom opening 110 from which extends two feet 112. The feet 112 are used to secure the cassette 100 in a predetermined position. The cassette 100 further includes flanges 115 for use in transporting the cassette 100, either by hand, or by robotic means. The wafer cassette 100 is exemplary of those used in the chemical cleaning stages of semiconductor wafer processing.

One skilled in the art should appreciate that the primary structural support for the cassette 100 comes from the end wall 102. The end wall 102 is the largest continuous surface of the entire cassette 100, and therefore must remain straight and rigid if the cassette 100 is to carry wafers 116 in predetermined positions. Should the end wall 102 begin to warp, or become distorted, the positions of wafers 116 contained within the cassette 100 invariably are changed. The present invention therefore directs warp measurements of the cassette 100 at the end wall 102.

Figure 2:
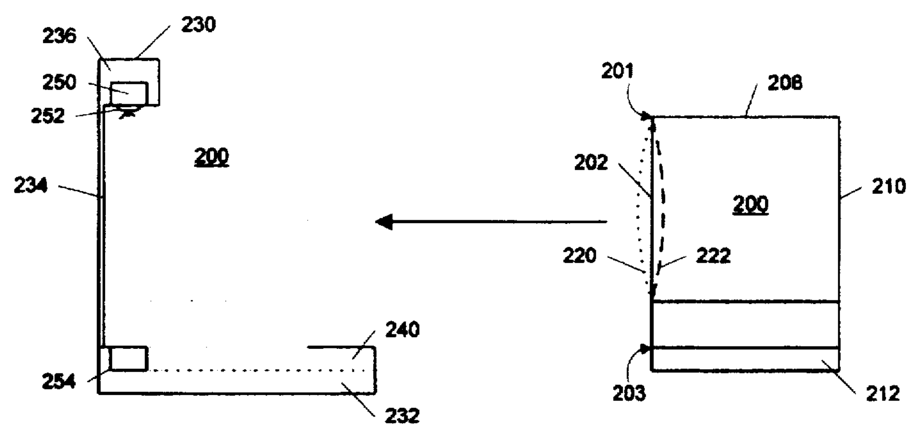
FIG. 2 a side view of a wafer cassette for insertion in a warp measuring device according to the present invention.

Referring now to FIG. 2, a side perspective of a wafer cassette 200 is shown which is positioned into a warp test device 230 according to the present invention. As in FIG. 1, the cassette 200 includes an end wall 202, an H-bar 210, an opening 208, and extension feet 212. The end wall 202 has a first edge 201 along a top surface of the cassette 200, and a second edge 203 along a bottom surface of the cassette 200. By dashed lines, the end wall 202 is shown to have a convex surface 220, or a concave surface 222, depending on the degree and type of warp located thereon.

The cassette 200 is represented by dashed lines to be secured within the warp test device 230. The test device 230 includes a base 232, a back wall 234, and a top 236. Within the base 232 is a mounting structure 240 for securing the cassette 200 in a predetermined position. In one embodiment, the cassette 200 is positioned so that the end wall 202 is parallel, and in close proximity to the back wall 234.

Within the top 236 is a light transmission device 250 into which a plurality of laser diodes 252, or other similar light sources, is placed. The light transmission device 250 is positioned within the top 236 to arrange the laser diodes 252 across the top of the end wall 202 of the cassette 200. The number and type of laser diodes 252 depend on the width of the end wall 202 to be tested, as well as the accuracy desired by the test. In one embodiment, five laser diodes 252 are placed within the device 250, spaced linearly across the top of the end wall 202.

Within the base 232 is a light reception device 254 into which is mounted a plurality of photo detectors (not shown), or other similar light receivers, corresponding to the number of light sources used. The light reception device 254 is positioned within the base 232 to arrange the photo detectors across the bottom of the end wall 202 of the cassette 200. The photo detectors are spaced linearly across the bottom of the end wall 202.

In operation, to test the warp of the end wall 202 of a cassette 200, the cassette 200 is positioned within the test device 230. The light transmission device 250 shines light across the end wall 202, and the light is received by the light reception device 254. Depending on the nature and degree of warp in the end wall 202, the amount of light received by the reception device 254, and the location of the light received by the reception device 254, will vary. This is particularly illustrated in FIG. 3.

Figure 3:
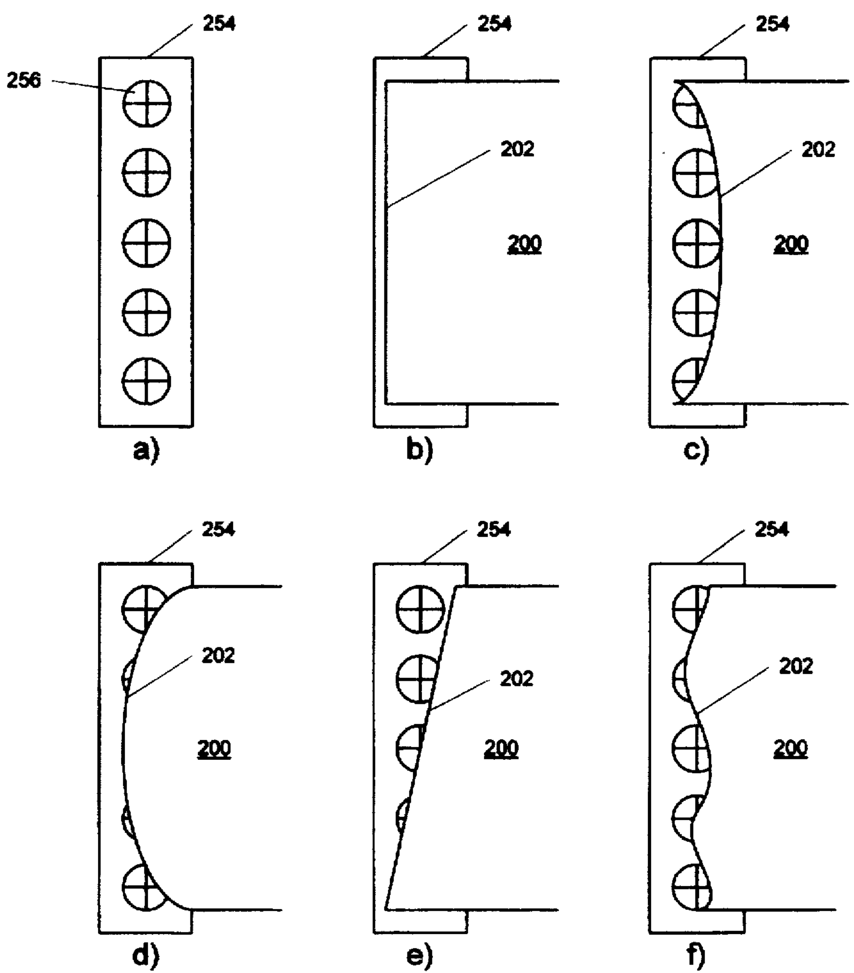
FIGS. 3A–3F are down views of a plurality of wafer cassettes, having different warp characteristics, inserted over an array of photo detectors mounted within the warp measuring device of FIG. 2.

FIG. 3, shows six different possibilities of warp for the end wall 202 of the wafer cassette 200, labeled a) through f). In diagram a), a top down view is provided, illustrating five photo detectors 256 mounted within a light reception device 254. In one embodiment, the photo detectors 256 are four segment position sensitive photo detectors, each capable of distinguishing light received in one of four different quadrants. Five similarly mounted laser diodes are mounted in a corresponding light transmission device (not shown). In diagram a), all five photo detectors 256 receive transmitted light, indicating that a cassette 200 is not inserted into the test device 230.

In diagram b), a cassette 200 is shown positioned into the test device 230. In this diagram, the end wall 202 is not warped, so the end wall 202 blocks all of the light transmitted by the light transmission device 250. Therefore, none of the photo detectors 256 receives any light. This indicates that the end wall 202 is not warped.

In diagram c), a cassette 200 is shown positioned into the test device 230. In this diagram, the end wall 202 is concave. Thus, some, but not all of the photo detectors 256 receive light transmitted by the light transmission device 250. By measuring the amount of light received by each of the photo detectors 256, and by comparing the amount of light received by each of the photo detectors 256, an understanding may be had regarding the nature of warp on the end wall 202, as well as the degree of warp. If this warp falls outside of a predetermined standard, the cassette 200 should not be used for wafer fabrication.

In diagram d), a cassette 200 is shown which has a convex end wall 202. By testing a comparison as described above, the amount of light received by the photo detectors 254 can determine the nature and degree of warp in the end wall of the cassette 200.

In diagram e), a cassette 200 is shown which has an angled end wall 202. The amount of light received by the photo detectors 254 can determine the nature and degree of warp in the end wall 202 of the cassette 200.

In diagram f), a cassette 200 is shown which has an irregular warp in the end wall 202. Again, the amount of light received by each of the photo detectors 254, as well as a comparison of the amount of light received by each of the photo detectors 254, can indicate the degree and nature of the warp. If the degree or nature of the warp falls outside of a predetermined standard, the cassette 200 should be scrapped.

Figure 4:
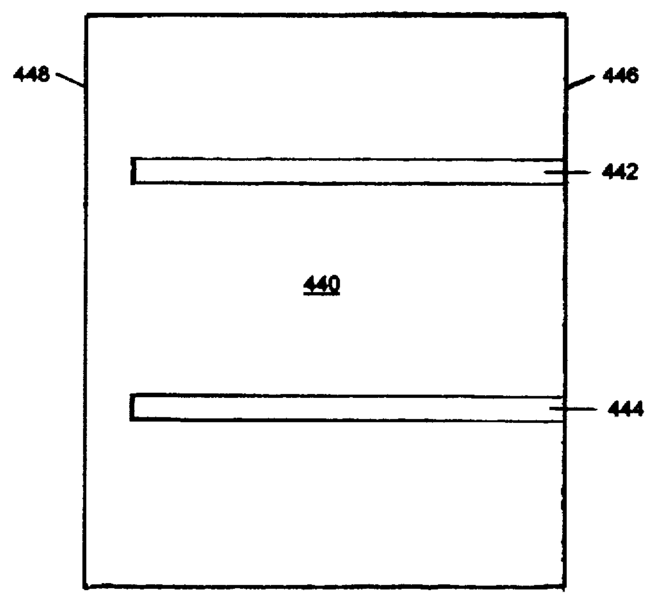
FIG. 4 is a top down view of a mounting structure for securing a wafer cassette within the warp measuring device of FIG. 2.

Now referring to FIG. 4, a mounting structure 440 is shown which is secured within the base 232 of the test device 230. The mounting structure 440, in one embodiment, includes two channels 442, 444 into which the feet 212 of the wafer cassette 200 may be inserted. The channels 442, 444 extend to the open end 446 of the mounting structure 440 to allow insertion of the cassette feet 212, but stop short of the opposite wall 448 of the mounting structure 440, to place the end wall 202 of cassettes in a fixed, repeatable relationship with respect to the light transmission device 250 and the light reception device 254.

Figure 5:
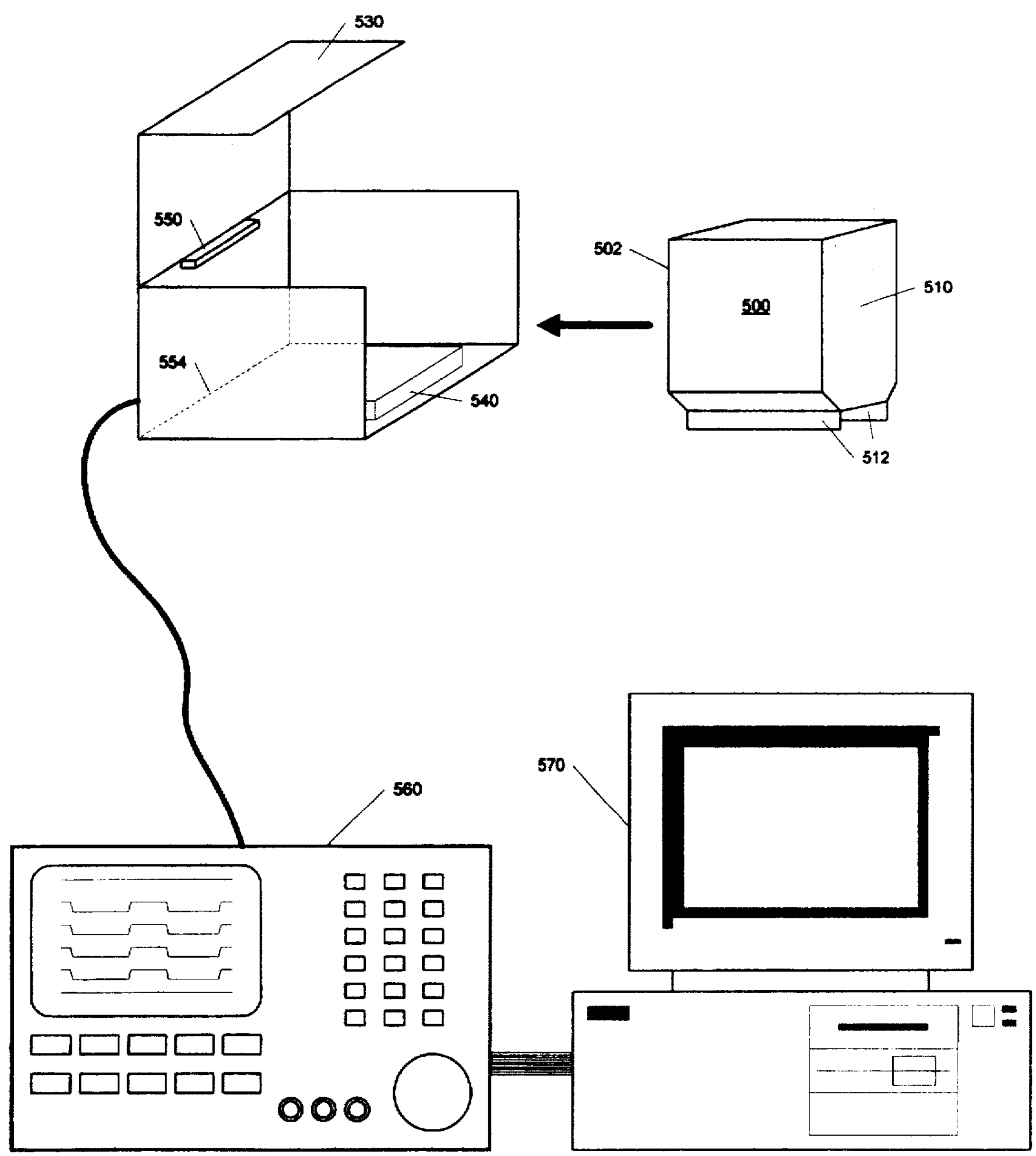
FIG. 5 is a block diagram of the warp measuring device according to the present invention, connected to an electronic test apparatus.

Now referring to FIG. 5, a cassette 500 is shown for insertion into a test device 530. Elements in FIG. 5 that are also illustrated in FIG. 2 have like numbers to FIG. 2, with the hundreds digit replaced with a 5. The test device 530 is shown connected to electronic test equipment 560, such as a logic analyzer or oscilloscope, which is also connected to a computer 570 to create an automated test environment for measuring and recording warp of wafer cassettes. In one embodiment, every cassette used within a processing environment is assigned a tracking number. Then, as each cassette is placed within the warp test device 530, the particular cassette is identified, by either scan or manual input, and the test results of the cassette are placed into a history file. Statistics are then developed which identify the nature and degree of warp in either individual cassettes, or series of cassettes used in various stages of semiconductor processing. Measuring and recording of cassettes allows heuristics to be developed to better understand the relationship between particular wafer processing stages, and their effect on material types of cassettes.

Although the present invention and its advantages have been described in considerable detail, those skilled in the art should appreciate that they can readily use the disclosed conception and specific embodiments as a basis for designing or modifying other structures for carrying out the same purposes of the present invention. For example, the mounting structures shown in FIGS. 4 and 5 are exemplary only. Other mounting structures or jigs may be developed to secure cassettes of different sizes and dimensions within a test device according to the present invention. Also, the test device shown in FIG. 2 illustrates a light transmission device, and light receiving device, that measure warp across the length of the end wall of a cassette. It may be desirable to measure warp across the width of the end wall, either as a substitute for, or in addition to, measuring warp across the length of the end wall. Furthermore, an array of laser diodes, and an array of photo detectors have been shown for transmitting and receiving light. It is possible that other light sources, or other light detectors could be used, such as photo diodes, without departing from the idea of measuring surface distortions in a cassette to determine warp.

In addition, it should be understood that various changes, substitutions and alterations can be made herein without departing from the spirit and scope of the invention as defined by the appended claims.

I claim:

1. An apparatus for measuring warp of a wafer cassette, the apparatus comprising:

a mounting structure, for securing the wafer cassette in a predetermined position;

a light transmitter, disposed at a top end of a first surface of the wafer cassette, when the wafer cassette is secured by said mounting structure, said light transmitter for transmitting a light reference along a plane substantially parallel to the first surface of the wafer cassette; and a light receiver, disposed at a bottom end of the first surface of the wafer cassette, when the wafer cassette is secured by said mounting structure, said light receiver for receiving said light reference transmitted by said light transmitter; and a housing, connected to said mounting structure, to said light transmitter, and to said light receiver, said housing for establishing a repeatable reference position between the wafer cassette and said light transmitter and said light receiver;

wherein measurement of light received by said light receiver from said light transmitter indicates warp on the first surface of the wafer cassette.

2. The apparatus for measuring warp, as recited in claim 1, wherein the wafer cassette is a Teflon cassette for holding a plurality of semiconductor wafers during processing.

3. The apparatus for measuring warp, as recited in claim 1, wherein said mounting structure comprises a rigid plate having a substantially flat surface, said rigid plate having first and second grooves extending latitudinally across said flat surface, said first and second grooves for securing corresponding feet extending from a bottom surface of the wafer cassette.

4. The apparatus for measuring warp, as recited in claim 1, wherein said light transmitter comprises a plurality of laser diodes.

5. The apparatus for measuring warp, as recited in claim 4, wherein said plurality of laser diodes are arranged in an array.

6. The apparatus for measuring warp, as recited in claim 1, wherein said light transmitter comprises a plurality of laser beams.

7. The apparatus for measuring warp, as recited in claim 1, wherein the first surface of the wafer cassette is an end wall, substantially parallel to inserted semiconductor wafers.

8. The apparatus for measuring warp, as recited in claim 1, wherein the first surfaces of the wafer cassette is a end wall, substantially parallel to an H-bar surface.

9. The apparatus for measuring warp, as recited in claim 1, wherein said light receiver comprises a plurality of photo detectors.

10. The apparatus for measuring warp, as recited in claim 9, wherein said plurality of photo detectors are arranged in an array.

11. The apparatus for measuring warp, as recited in claim 9, wherein said plurality of photo detectors comprises four segment photo detectors.

12. The apparatus for measuring warp, as recited in claim 1, wherein when the wafer cassette is secured by said mounting structure, if the first surface of the wafer cassette is not warped, the first surface substantially blocks said transmitted light reference from being received by said light receiver.

13. The apparatus for measuring warp, as recited in claim 1, wherein when the wafer cassette is secured by said mounting structure, if the first surface of the wafer cassette is sufficiently warped, the first surface allows some of said transmitted light reference to be received by said light receiver.

14. The apparatus for measuring warp, as recited in claim 1, further comprising:

measurement means, connected to said light receiver, for measuring the amount of light received by said light receiver.

15. The apparatus for measuring warp, as recited in claim 14, wherein if said measurement means determines that the amount of light received by said light receiver is above a predetermined threshold, a secured wafer cassette is considered warped.

16. The apparatus for measuring warp, as recited in claim 14, wherein said measurement means comprises a logic analyzer.

17. A measurement system, for determining surface warp on a end wall of a semiconductor wafer cassette, the measurement system comprising:

a housing;

a mounting mechanism, attached to said housing, for securing the wafer cassette in a predetermined position, the predetermined position placing the end wall of the wafer cassette parallel with, and in proximity to, a first plane;

an array of laser diodes, attached to said housing, arranged parallel to the first plane, said array of laser diodes for transmitting a light reference across the end wall of the wafer cassette;

an array of photo detectors, attached to said housing, arranged parallel to the first plane, and opposite said array of laser diodes, said array of photo detectors for receiving said transmitted light reference; and electronic test equipment, connected to said array of photo detectors, for monitoring said transmitted light reference received by said array of photo detectors;

wherein the amount of said transmitted light reference received by said array of photo detectors varies, depending on the amount of warp on the end wall of the wafer cassette.

18. The measurement system for determining surface warp, as recited in claim 17, wherein said mounting mechanism comprises a jig, conformed to secure feet extending from the wafer cassette.

19. The measurement system for determining surface warp, as recited in claim 17, wherein said mounting mechanism comprises a vice, for clamping opposite sides of the wafer cassette.

20. The measurement system for determining surface warp, as recited in claim 19, wherein the opposite sides of the wafer cassette are parallel to the end wall.

21. The measurement system for determining surface warp, as recited in claim 17, wherein said array of laser diodes extends substantially along a first edge of the end wall of the wafer cassette.

22. The measurement system for determining surface warp, as recited in claim 17, wherein said array of photo detectors extends substantially along a second edge of the end wall of the wafer cassette, which is parallel to the first edge.

23. The measurement system for determining surface warp, as recited in claim 17, wherein said array of photo detectors comprise four segment photo detectors.

24. The measurement system for determining surface warp, as recited in claim 23, wherein said four segment photo detectors can individually detect said transmitted light reference in any one of said four segments.

25. The measurement system for determining surface warp, as recited in claim 17, wherein said electronic test equipment comprises a logic analyzer.

26. The measurement system for determining surface warp, as recited in claim 17, wherein said electronic test equipment comprises an oscilloscope.

27. The measurement system for determining surface warp, as recited in claim 17, further comprising:

a computer, attached to said electronic test equipment, for recording said monitored light reference received by said array of photo detectors.

28. The measurement system for determining surface warp, as recited in claim 17, wherein when the end wall of the wafer cassette is not warped, the amount of said transmitted light reference received by said array of photo detectors is substantially zero.

29. The measurement system for determining surface warp, as recited in claim 17, wherein when the end wall of the wafer cassette is warped beyond a predetermined standard, the amount of said transmitted light reference received by said array of photo detectors exceeds a predetermined value.

30. The measurement system for determining surface warp, as recited in claim 17, wherein each photo detector within said array of photo detectors provides a signal to said electronic test equipment indicative of said light reference it receives.

31. The measurement system for determining surface warp, as recited in claim 30, wherein said electronic test equipment, by monitoring said signal from each of said photo detectors, can determine the nature and degree of warp in the end wall of the wafer cassette.

* * * * *